US010310135B2

(12) United States Patent
Wu

(10) Patent No.: US 10,310,135 B2
(45) Date of Patent: Jun. 4, 2019

(54) CALIBRATION OF GRADIOMETER TOOLS USING CURRENT LOOP WITH FINITE DIMENSION AND RANGING OPERATION

(71) Applicant: Halliburton Energy Services, Inc., Houston, TX (US)

(72) Inventor: Hsu-Hsiang Wu, Sugar Land, TX (US)

(73) Assignee: Halliburton Energy Services, Inc., Houston, TX (US)

(*) Notice: Subject to any disclaimer, the term of this patent is extended or adjusted under 35 U.S.C. 154(b) by 0 days.

(21) Appl. No.: 15/771,269

(22) PCT Filed: Jul. 27, 2016

(86) PCT No.: PCT/US2016/044301
§ 371 (c)(1),
(2) Date: Apr. 26, 2018

(87) PCT Pub. No.: WO2018/022043
PCT Pub. Date: Feb. 1, 2018

(65) Prior Publication Data
US 2019/0137654 A1 May 9, 2019

(51) Int. Cl.
*G01V 13/00* (2006.01)
*G01V 3/10* (2006.01)
(52) U.S. Cl.
CPC .............. *G01V 13/00* (2013.01); *G01V 3/10* (2013.01)
(58) Field of Classification Search
CPC .................................. G01V 13/00; G01V 3/10
See application file for complete search history.

(56) References Cited

U.S. PATENT DOCUMENTS

| 2010/0332137 | A1 | 12/2010 | Meadows et al. |
| 2011/0018542 | A1 | 1/2011 | Clark et al. |
| 2012/0161788 | A1 | 6/2012 | Siewick et al. |
| 2012/0210783 | A1* | 8/2012 | Carroll ..................... G01V 7/00 |
| | | | 73/382 G |
| 2015/0268371 | A1* | 9/2015 | Donderici ......... E21B 47/02216 |
| | | | 324/346 |

FOREIGN PATENT DOCUMENTS

| WO | WO 2014/089490 A9 | 6/2014 |
| WO | WO 2015/030872 A1 | 3/2015 |

OTHER PUBLICATIONS

International Search Report and the Written Opinion of the International Search Authority, or the Declaration, dated Jan. 6, 2017, PCT/US2016/057517, 15 pages, ISA/KR.

* cited by examiner

*Primary Examiner* — Tung X Nguyen
*Assistant Examiner* — Dominic E Hawkins
(74) *Attorney, Agent, or Firm* — Haynes and Boone, LLP

(57) ABSTRACT

A method for calibrating a gradiometer tool, method for ranging, calibrated gradiometer tool, and ranging system are disclosed. A gradiometer tool may be included along a drilling string and have at least one magnetic field sensor, a processor, and a memory storing a recovery matrix obtained by modeling a set of magnetic field values extent at the at least one sensor over the range of tool face angles due to a known current flowing through a current loop of known finite dimensions at a known distance with respect to the gradiometer tool and calculating at least one effective distance corresponding to at least one of the set of magnetic field values that would arise if the gradiometer tool is placed to a theoretical infinite line source carrying the current at the effective distance.

20 Claims, 12 Drawing Sheets

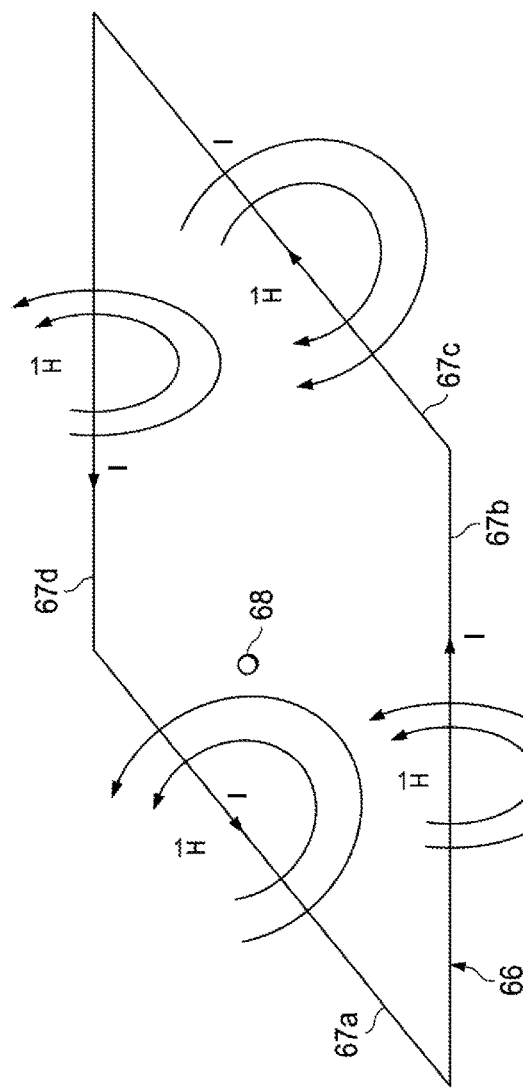
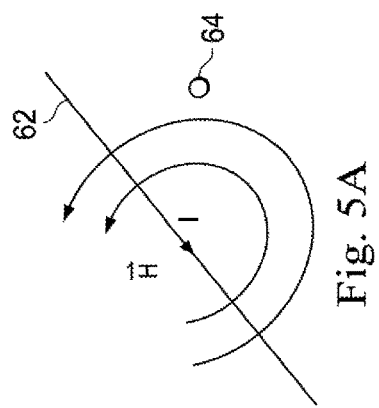

CALIBRATION OF GRADIOMETER TOOLS USING CURRENT LOOP WITH FINITE DIMENSION AND RANGING OPERATION

PRIORITY

The present application is a U.S. National Stage patent application of International Patent Application No. PCT/US2016/044301, filed on Jul. 27, 2016, the benefit of which is claimed and the disclosure of which is incorporated herein by reference in its entirety.

TECHNICAL FIELD

The present disclosure generally relates to wellbore drilling operations, and more particularly, to methods and systems for tracking the drilling of multiple wellbores relative to one another. Most particularly, embodiments of this disclosure relate to methods and systems for determining the relative location of a target wellbore from a wellbore being drilled using a magnetic gradiometer.

BACKGROUND

As easy-to-access and easy-to-produce hydrocarbon resources are depleted, there is an increased demand for more advanced recovery procedures. One such procedure is steam assisted gravity drainage (SAGD), a procedure that utilizes steam in conjunction with two spaced apart wellbores. Specifically, SAGD addresses the mobility problem of heavy oil in a formation through the injection of high pressure, high temperature steam into the formation. This high pressure, high temperature steam reduces the viscosity of the heavy oil in order to enhance extraction. The injection of steam into the formation occurs from a first wellbore (injector) that is drilled above and parallel to a second wellbore (producer). As the viscosity of the heavy oil in the formation around the first wellbore is reduced, the heavy oil drains into the lower second wellbore, from which the oil is extracted. Preferably, the two wellbores are drilled at a distance of only a few meters from one other. The placement of the injector wellbore needs to be achieved with very small margin in distance. If the injector wellbore is positioned too close to the producer wellbore, the producing wellbore would be exposed to very high pressure and temperature. If the injector wellbore is positioned too far from the producer wellbore, the efficiency of the SAGD process is reduced. In order to assist in ensuring that the second wellbore is drilled and positioned as desired relative to the first wellbore, a survey of the two wellbores in the formation is often conducted. These surveying techniques are traditionally referred to as ranging.

One solution that has been employed in ranging is to deploy an electromagnetic field gradiometer tool in the wellbore being drilled and inject an alternating current in the casing of the target wellbore to produce a time-varying magnetic field about the casing. The gradiometer tool includes coils or other sensors that generate electromotive force via inductance in the presence of the time-varying magnetic field, which may be processed for ranging. However, imperfections in gradiometer tool manufacture can affect response voltages of its sensors to the magnetic field gradient. Because precise response voltages are required for the effective ranging analysis, such tool imperfections must be compensated. Compensation may be effected by mathematical characterization of the overall tool response to a current loop of given parameters in a laboratory environment prior to use in the field.

BRIEF DESCRIPTION OF THE DRAWINGS

Embodiments are described in detail hereinafter with reference to the accompanying Figures, in which:

FIGS. 5A and 5B are diagrammatic displays of a theoretical infinite line source and a finite current loop source, respectively, and the resultant magnetic fields produced by current flowing therethrough;

DETAILED DESCRIPTION

Figure 1:
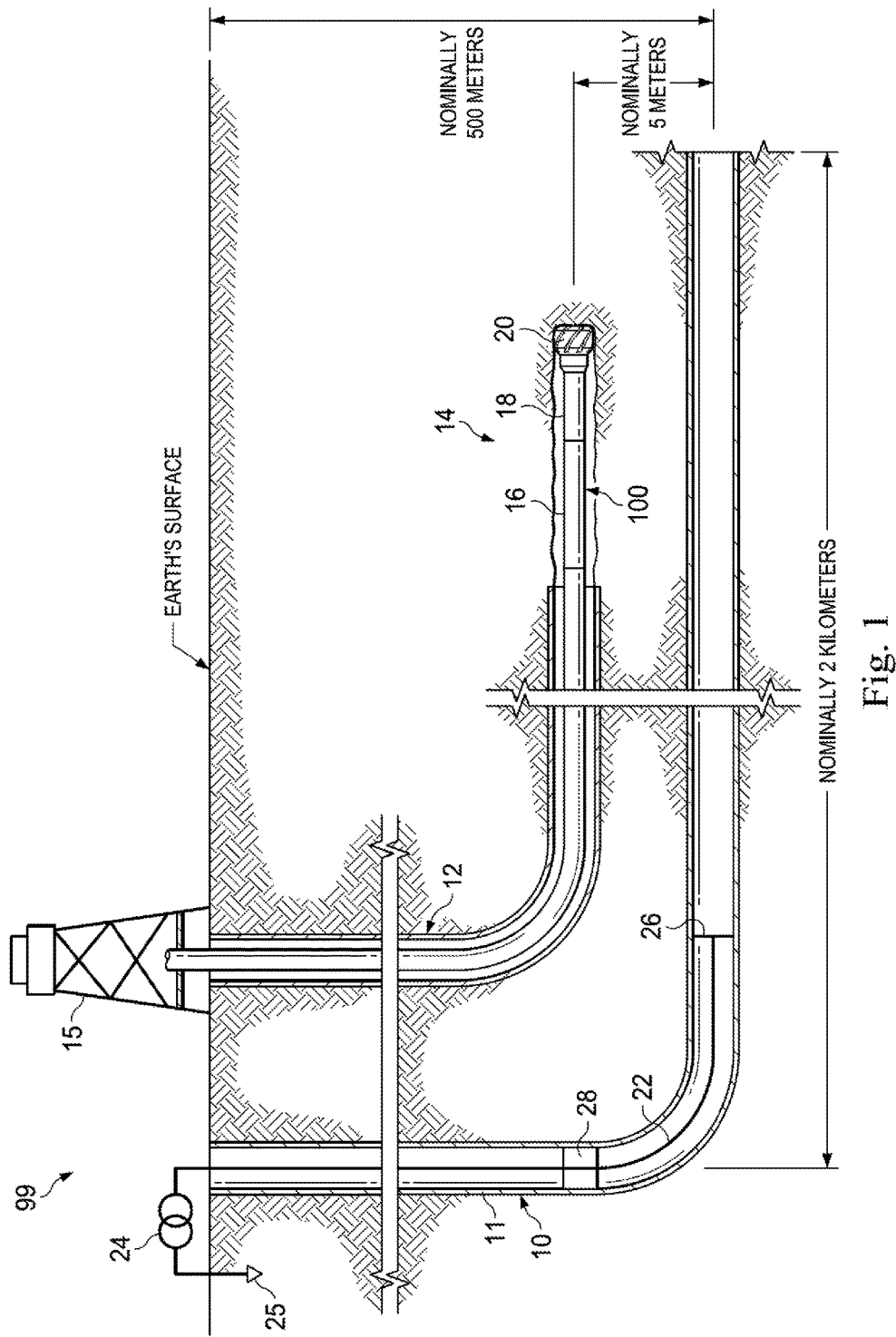
FIG. 1 is an elevation view in cross-section of a SAGD drilling system according to certain illustrative embodiments of the present disclosure.

The present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper," "uphole," "downhole," "upstream," "downstream," and the like, may be used herein for ease of description to describe one element or feature's relationship to another element(s) or feature(s) as illustrated in the Figures. The spatially relative terms are intended to encompass different orientations of the apparatus in use or operation in addition to the orientation depicted in the figures.

FIG. 1 illustrates a SAGD drilling system 99 according to an illustrative embodiment of the present disclosure. In this embodiment, a target wellbore 10 is drilled using any suitable drilling technique. Thereafter, target wellbore 10 is cased with casing string 11. An injector wellbore 12 is then drilled using bottom hole assembly (BHA) 14 which extends from derrick 15. BHA 14 may be, for example, a logging-while drilling (LWD) assembly, measurement-while drilling assembly (MWD) or other desired drilling assembly. As such, BHA 14 may further include a drilling motor 18 and drill bit 20. Although injection wellbore 12 is described as being subsequently drilled, in other embodiments target wellbore 10 and injection wellbore 12 may be drilled simultaneously. Moreover, in yet another alternate embodiment, BHA 14 may be embodied as a wireline application (without a drilling assembly) performing logging operations, as will be understood by those same ordinarily skilled persons mentioned herein. In this exemplary embodiment, the BHA/drilling assembly 14 includes a gradiometer tool 100, disposed within a sensor sub 16, having one or more magnetic sensors and circuitry for data communication to and from the surface, as will be described in more detail below.

Generally, the method of the present disclosure includes producing a direct current (DC) or low frequency alternating current (AC) along casing string 11 of target wellbore 10 by a direct connection to an electric current supply (e.g., AC power supply) to the target wellbore 10 during periodic interruptions in the drilling of the wellbore being drilled, i.e., the injection wellbore 12. During these interruptions, measurements are taken by gradiometer tool 100 at multiple selected depth intervals with instruments near the drill bit 20 in the injection wellbore 12, the measurements including the magnitude, the direction and the radial gradient of the magnetic field produced by the current flow along the target wellbore 10. At the same time, measurements are made of the magnitude and the direction of the earth's magnetic field and of the direction of gravity in the wellbore being drilled, e.g. by an MWD tool along BHA 14 to determine the roll angle and inclination of the drilling wellbore. Including information derived from standard MWD measurements, the distance and the direction between the injection wellbore 12 and target wellbore 10 can be determined using gradiometer tool 100 and method for calibration thereof disclosed.

More particularly, and in accordance with certain illustrative embodiments of the present disclosure, a time-varying magnetic field is produced about casing string 11 of the target wellbore 10 by injecting time-varying current from an electric current supply 24 via a connection 22 and an electrode 26 disposed in the target wellbore 10 and connected to casing 11, as shown in FIG. 1, or by direct connection such as at the surface (not illustrated). Preferably, low frequency, (approximately 0.1 to 30 Hertz, for example) electric current with between 5 and 30 $A_{rms}$ is provided by the current source 24. Current may be returned to supply 24 via the earth and grounding rod 25 (or a nearby well head), as illustrated, or via another connection and downhole electrode (not illustrated). Connection 22 may be, for example, an insulated wireline.

To enhance current on the target wellbore 10 near the depth of measurement, and hence the resultant magnetic field, insulating section 28 in that wellbore may be included as shown in FIG. 1, either on one (as shown) or both sides (not shown) of the target area of investigation. Thus, in one preferred embodiment, a non-conductive element, insulator, gap or insulating section of casing may be disposed in the target wellbore upstream of the current injection point, thus serving as insulating section 28.

The current injected into the target wellbore 10 bleeds off exponentially with distance away from the injection point. If current is injected at the well head, it bleeds off exponentially from that point. If current is injected into wellbore 10 from a down-hole electrode, the current bleeds off in both directions from that point, and the net current available for electromagnetic field generation can be computed using well known principles.

In one or more embodiments, the gradiometer tool 100, housed in sensor sub 16, is extremely sensitive to the magnetic fields and most importantly to the radial gradient of the magnetic flux in the wellbore being drilled (i.e., injection wellbore 12). For one application of interest i.e., the drilling of SAGD wells, the radial gradient across the injection wellbore 12 may be intrinsically about fifty times less than magnetic field itself, i.e., the ratio of the seven-meter desired range and the diametrical size of the magnetic gradient measuring instrument. Thus, a distance measurement with five percent precision preferable uses magnetic sensors along sub 16 which have an intrinsic 1/1000 resolution, stability and signal to noise rejection. Such precision is desired not only for eventual oil production requirements, but also to enable the driller to drill a dogleg-free wellbore, i.e., a straight bore hole as opposed to a spiral or S-shaped wellbore, as is also required for easy deployment of steel casing in the injection wellbore 12.

Figure 2A:
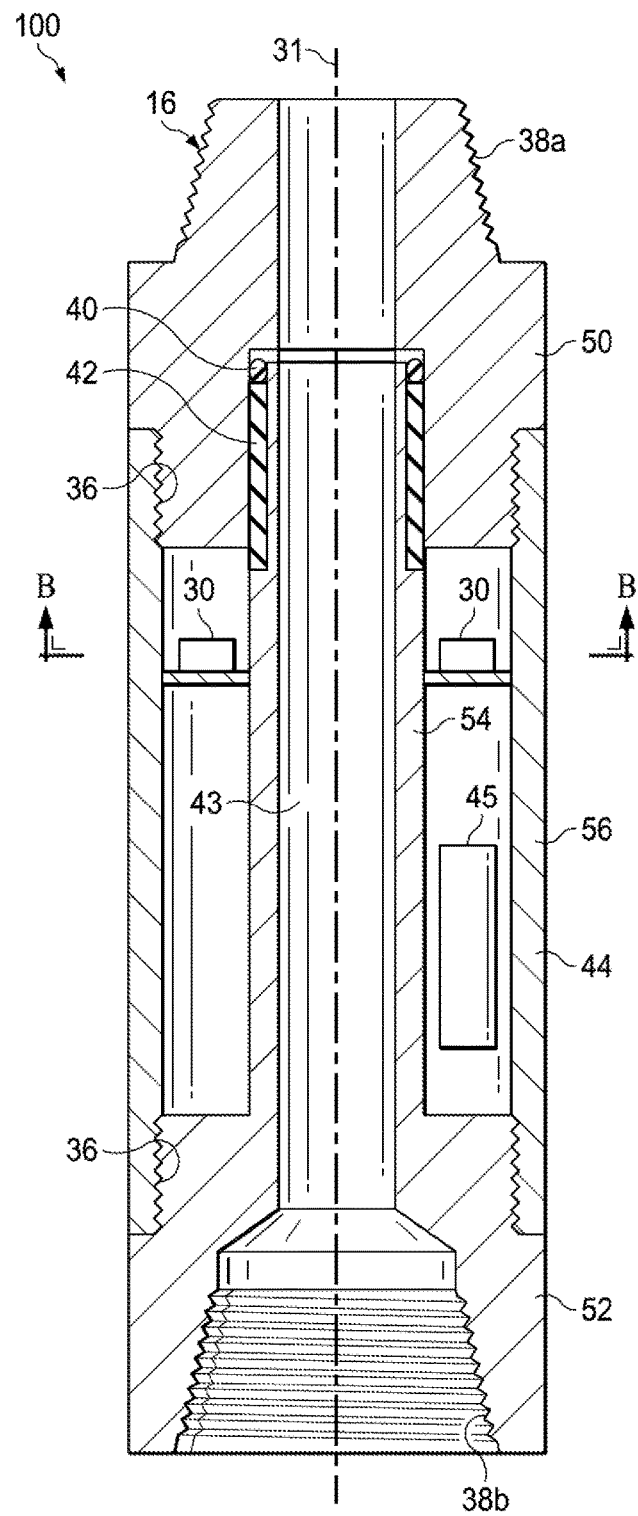
FIG. 2A is an axial cross-sectional view of a sensor sub of the drilling system of FIG. 1, the sensor sub including a gradiometer tool according to an illustrative embodiment of the present disclosure.

FIG. 2A illustrates an axial cross-section of sensor sub 16, according to an illustrative embodiment of the present disclosure. The mechanical construction of sensor sub 16 may upper and lower members 50, 52, and tubular inner and outer sleeves 54, 56. Upper and lower members include threaded connections 36 for assembly with outer sleeve 56 and box 38a and pin 38b threads for connecting to the drill string. As the interior bore 43 through inner sleeve 54 may be used to convey drilling fluid, inner sleeve 54 may be sealed with upper member 50 (and/or lower member 52) with one or more O-rings 40.

In general, even a tiny electrical current flowing through inner sleeve 54 can adversely impact operation of gradiometer tool 100 by creation of a magnetic field about inner sleeve 54. Accordingly, tubular dielectric insulator 42 may be provided to inhibit electric current flow through inner sleeve 54. However, a small electrical current flowing though outer sleeve produces a negligible magnetic field inside sensor sub 16 where sensors 30 are located.

Sensor sub 16 may also include one or more modules 45, which may contain, for example, MWD, gravity, earth magnetic field sensors, and processing, communication, power supply, and control circuits.

Figure 2B:
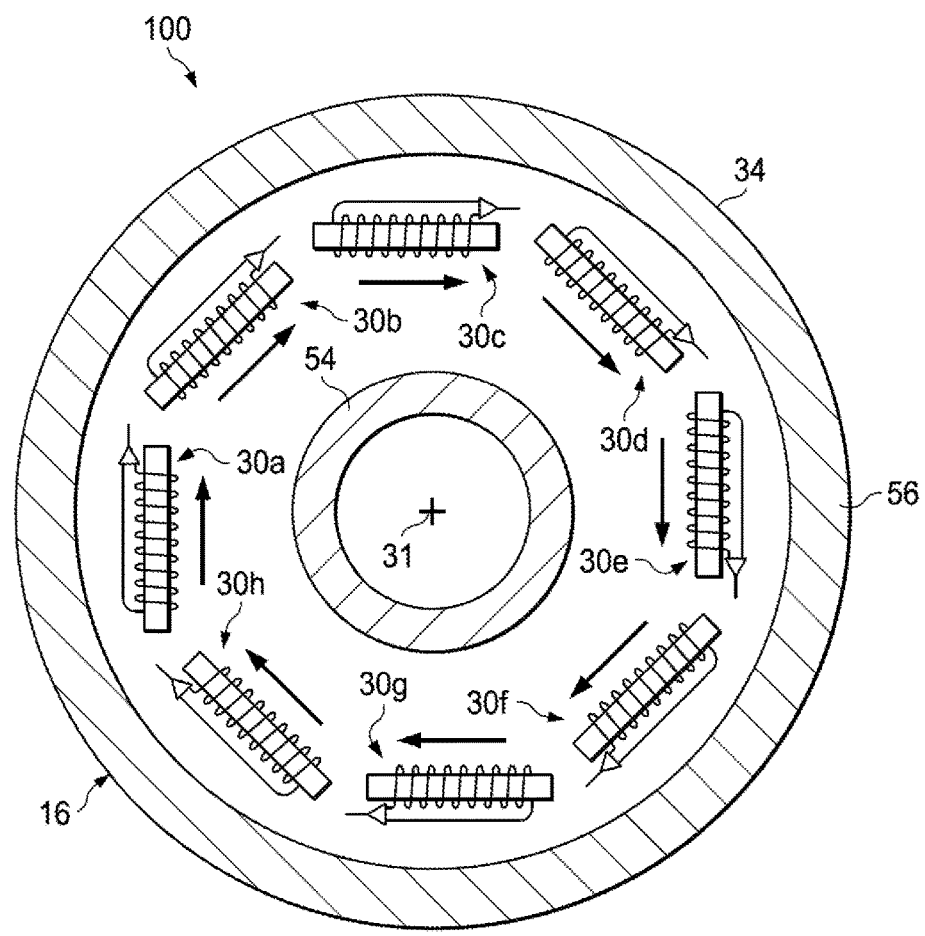
FIG. 2B is a transverse cross-sectional view of the sensor sub of FIG. 2A taken along lines B-B of FIG. 2A.

FIG. 2B illustrates a transverse cross-section of sensor sub 16, showing an arrangement of eight magnetic sensor coils 30a-30h. Gradiometer tool 100 may have desirable properties for making good measurements of the radial magnetic field gradient. Gradiometer tool 100 may include eight primary magnetic field component sensors 30, e.g., fluxgates or induction coils, as shown in FIG. 2B, with axes of sensitivity perpendicular to the drilling axis and located as far radially as possible from the axis 31 of the drilling tool as the bottom hole drilling assembly diameter will allow. In the embodiment of FIG. 2B, sensors 30 are located 45 degrees with respect to each other around tool axis 31. Such a configuration gives an optimized response to the radial electromagnetic field gradient and minimizes blind spots.

Although eight sensor coils 30 are illustrated in gradiometer tool 100 of FIG. 2B, other numbers (more or less than eight) and configurations of sensors 30, separated from each other, with axes of sensitivity perpendicular to the longitudinal axis of the tool, may be used. In addition, a Z-axis magnetic field sensor (not illustrated) may be included.

Incorporation of a Z-axis sensor may also be helpful for compensating for the effects of axial components of the magnetic field which may be present. A Z-axis sensor, if provided, may be oriented perpendicular to sensors 30 and parallel to the primary axis 31 of sensing sub 16.

Induction coil sensors 30 generate ac output voltages by induction in the presence of time-varying magnetic flux resulting from the alternating current flow sling the target wellbore casing 11. The output voltage of each coil 30 is proportional to the amplitude of the magnetic flux passing through the coil parallel sensor axis. Each coil 30 may be connected to processing circuitry (not expressly shown), which may include a low noise, high gain, band pass amplifier, rectifier, filter, or like circuitry. The outputs may be sampled and processed by downhole microprocessor (not expressly shown) for ranging analysis.

Figure 3:
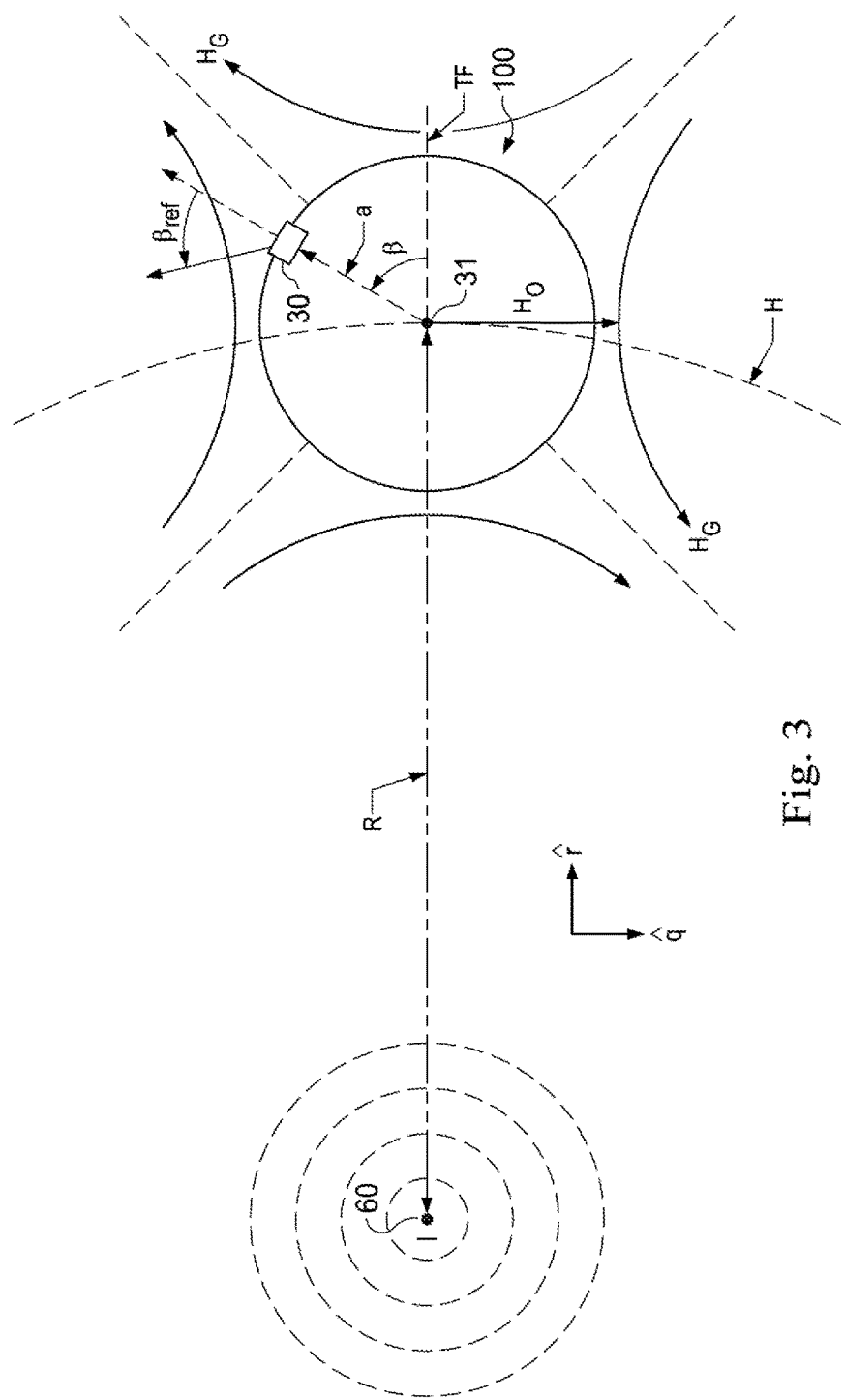
FIG. 3 is a diagrammatic display of a gradiometer tool with a single sensor according to one or more embodiments disposed parallel to a linear current conductor, showing uniform and gradient magnetic field lines.

FIG. 3 shows gradiometer tool 100 (having a single sensor 30 for simplicity of explanation) disposed parallel to an linear conductor (which may be one side of a current loop or casing 11 (FIG. 1), for example) that carries current amplitude of I at a distance R from the ranging tool center 31 to line source 60. As shown, current flows into the drawing sheet. Based on infinite line source approximations, the magnetic field H and magnetic field gradient G=dH/dR (i.e., the variation of the magnetic field with respect to position) at axis 31 of gradiometer tool 100 due to current flow I are given as:

$$H = \frac{I}{2\pi R} \qquad (Eq.\ 1)$$

$$G = \frac{-I}{2\pi R^2} \qquad (Eq.\ 2)$$

In exemplary FIG. 3, sensor 30 is located at a distance a from tool axis 31 at a tool face (azimuth) angle β with respect to tool face reference TF (defined in FIG. 3) along a line extending to line source 60). The magnetic field $H_S$ at sensor 30 may be expressed as a vector which resolved into a uniform field component $H_0$ and a gradient field component $H_G$ as follows:

$$H_S = H_0 + H_G = H\hat{q} + aG(\sin(\beta)\hat{q} + \cos(\beta)\hat{r}) \qquad (Eq.\ 3)$$

where $\hat{q}$ and $\hat{r}$ are unit vectors as shown in FIG. 3. Note that the gradient field component $H_G$, which varies with $1/R^2$ and accounts for the fact that magnetic field both curves and attenuates as 1/R, has a hyperbolic-like shape as indicated in FIG. 3.

Sensor 30 may be orientated at an offset angle $\beta_{ref}$ with respect to the tool face angle β direction. A total sensor offset, B, is given as:

$$B = \beta + \beta_{ref} \qquad (Eq.\ 4)$$

Sensor 30 develops a voltage proportional to the component of the magnetic field $H_S$ at the sensor location along its axis of sensitivity (which is a function of total sensor offset B). For instance, in one or more embodiments, sensor voltage is proportional to the varying magnetic flux lines that pass axially through an inductive sensor coil 30. This inductive sensitivity has the consequence that as gradiometer tool 100 is rotated about axis 31, the uniform magnetic field component $H_0$ contributes to generation of a sensor voltage that is proportional to the product of magnetic field strength H and (cos(B)+sin(B)).

Similarly, rotation of sensor 30 causes the gradient component $H_G$ of the magnetic field, which has a characteristic "hyperbolic" field line shape indicated in FIG. 3, to induce a sensor voltage proportional to a linear combination of terms proportional to the product of magnetic field gradient G, the sensor distance a from axis 31, and (cos(2B)+sin(2B)). To see how this comes about, consider with reference to FIG. 3 that rotation of sensor 30 through 360 degrees causes the gradient component $H_G$ of the magnetic field to cycle through 720 degrees.

Accordingly, the sensor voltage $V_S$ induced at a particular tool face angle β can be approximately expressed according to following relationship:

$$V_S(\beta) \propto H\cos(B) + H\sin(B) + G\cos(2B) + G\sin(2B) \qquad (Eq.\ 5)$$

Imperfections in gradiometer tool manufacture, including slight differences between sensor coils 30 or the positioning or orientation thereof within sensor sub 16, can affect response voltages of sensors 30 to the magnetic field gradient. Because precise response voltages are required for the effective ranging analysis, such imperfections of gradiometer tool 100 must be compensated. In one or more embodiments, compensation may be effected by mathematical characterization of the overall tool response to a finite current loop of given parameters in a controlled or laboratory environment, referred to as calibration, prior to use in the field, as now described.

Taking sensor misalignment, manufacturing tolerances, slight variations in sensor gains, the sensor distances a from tool axis 31, and any other appropriate proportionality coefficients into consideration, Equation 5 may be re-expressed with tool constant coefficients as:

$$V_S = T_{cH}H\cos(B) + T_{sH}H\sin(B) + T_{cG}G\cos(2B) + T_{sG}G\sin(2B) \qquad (Eq.\ 6)$$

Equation 6 may also be expressed as the matrix product of a row design vector with a columnar tool constant vector as:

$$V_S = \qquad (Eq.\ 7)$$

$$D_M \quad T_C = [H\cos(B) \quad H\sin(B) \quad G\cos(2B) \quad G\sin(2B)] \begin{bmatrix} T_{cH} \\ T_{sH} \\ T_{cG} \\ T_{sG} \end{bmatrix}$$

Figure 4:
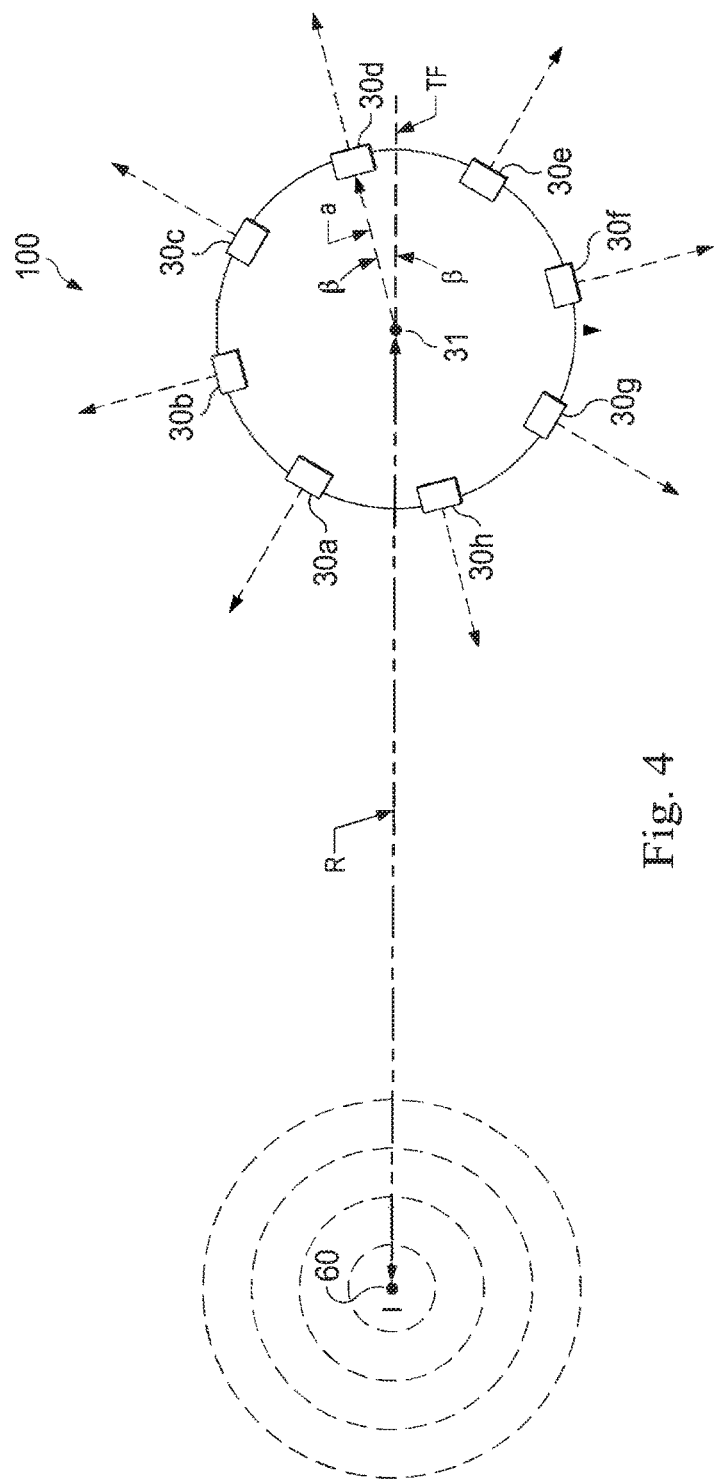
FIG. 4 is a diagrammatic display of a gradiometer tool with eight sensors according to one or more embodiments disposed parallel to a linear current conductor.

FIG. 4 illustrates gradiometer tool 100 eight sensors 30 disposed parallel to an linear conductor (which may be one side of a current loop or casing 11 (FIG. 1), for example) that carries current amplitude of I at a distance R from the ranging tool center 31 to line source 60. As shown, current flows into the drawing sheet. Equation 7 above may simply be extended to cover the embodiment of FIG. 4 by adding columns with tool constant coefficients to tool constant matrix $T_C$, as follows:

$$[V_1 \quad V_2 \quad \ldots \quad V_7 \quad V_8] = D_M \begin{bmatrix} T_{cH1} & T_{cH2} & \ldots & T_{cH7} & T_{cH8} \\ T_{sH1} & T_{sH2} & \ldots & T_{sH7} & T_{sH8} \\ T_{cG1} & T_{cG2} & \ldots & T_{cG7} & T_{cG8} \\ T_{sG1} & T_{sG2} & \ldots & T_{sG7} & T_{sG8} \end{bmatrix} \qquad (Eq.\ 8)$$

In Equations 7 and 8, the design matrix $D_M$ is based on assumption of infinite line source and may be approximated in a laboratory environment using a large finite current loop with a known alternating current I to calculate the magnetic field and gradient values H, G for a gradiometer tool oriented at a known tool face angle β and positioned at a known distance R from one leg of the current loop using well-known relations, such as the law of Biot Savart. Such calculation of the design matrix $D_M$ assumes perfect sensor measurement, orientation, and positioning.

The tool constant matrix $T_C$ allows for compensation of effects of the sensor misalignment and other defects on the measurements. Tool constant matrix $T_C$ may be determined by taking a series sensor voltage measurements $M_s$ at differing tool face angles β while holding the current I and distance R (and hence the magnetic field H and gradient G) constant. Because tool constant matrix $T_C$ includes four unknown values $T_{cH}$, $T_{sH}$, $T_{cG}$, and $T_{sG}$ for each sensor, sensor voltage measurements $M_s$ must be taken at a minimum of four differing tool face angles β in order to decouple and calculate tool constant matrix $T_C$. To avoid any blind spot issues, tool face angles ft should be selected so that the sensor 30 has sensitivity to the excitation source.

Thus, based on Equations 7 and 8 above, is it given:

$$M_S = D_{MC} T_C \quad \text{(Eq. 9)}$$

The sensor measurements array $M_s$ is recorded from the recorded sensor measurements at various tool face angles β. A calibration design matrix $D_{MC}$ is calculated at the various tool face angles β. Thus, both $M_s$ and $D_{MC}$ are thus known, thereby allowing calculation of tool constant matrix $T_C$ as:

$$T_C = D_{MC}^{-1} M_S \quad \text{(Eq. 10)}$$

Equation 9 may be expanded based on Equations 7 and 8 as Equations 11 and 12, respectively:

$$\begin{bmatrix} V_S(\beta_1) \\ V_S(\beta_2) \\ V_S(\beta_3) \\ V_S(\beta_4) \end{bmatrix} = \quad \text{(Eq. 11)}$$

$$\begin{bmatrix} H\cos(B_1) & H\sin(B_1) & G\cos(2B_1) & G\sin(2B_1) \\ H\cos(B_2) & H\sin(B_2) & G\cos(2B_2) & G\sin(2B_2) \\ H\cos(B_3) & H\sin(B_3) & G\cos(2B_3) & G\sin(2B_3) \\ H\cos(B_4) & H\sin(B_4) & G\cos(2B_4) & G\sin(2B_4) \end{bmatrix} \begin{bmatrix} T_{cH} \\ T_{sH} \\ T_{cG} \\ T_{sG} \end{bmatrix}$$

$$\begin{bmatrix} V_1(\beta_1) & V_2(\beta_1) & \ldots & V_8(\beta_1) \\ V_1(\beta_2) & V_2(\beta_2) & \ldots & V_8(\beta_2) \\ V_1(\beta_3) & V_2(\beta_3) & \ldots & V_8(\beta_3) \\ V_1(\beta_4) & V_2(\beta_4) & \ldots & V_8(\beta_4) \end{bmatrix} = D_{MC} \begin{bmatrix} T_{cH1} & T_{cH2} & \ldots & T_{cH8} \\ T_{sH1} & T_{sH2} & \ldots & T_{sH8} \\ T_{cG1} & T_{cG2} & \ldots & T_{cG8} \\ T_{sG1} & T_{sG2} & \ldots & T_{sG8} \end{bmatrix} \quad \text{(Eq. 12)}$$

where $D_{MC}$ in Equation 12 is identical to that in Equation 11 above.

In practice, sensor voltage measurements $M_S$ may be taken at a number of tool face angles β much greater than four, thereby resulting in an overdetermined system, i.e., sets of equations in which there are more equations than unknowns. For example, measurements may be made at thirty degree increments, resulting in twelve measurements per sensor to determine four unknown quantities in tool constant matrix $T_C$. In such a case, for an eight sensor gradiometer tool 100, sensor measurements matrix $M_s$ has twelve rows and eight columns (i.e., a 12×8 matrix), calibration design matrix $D_{MC}$ is a 12×4 matrix, and tool constant matrix $T_C$ is a 4×8 matrix. In an overdetermined system, a variant of a least squares regression analysis may be used to determine a best fit solution for tool constant matrix $T_C$ as:

$$T_C = (D_{MC}^T D_{MC})^{-1} D_{MC}^T M_S \quad \text{(Eq. 13)}$$

where the superscript "T" denotes a matrix transposition operation and the superscript "−1" denotes a matrix inversion operation.

Once the tool constant matrix $T_C$ has been determined by laboratory calibration as described above, in field operations, sensor voltage measurements may be taken downhole, and the design matrix $D_M$, now the unknown quantity, may be calculated using a sensor measurements row vector $M_S$ and tool constant matrix $T_C$. In one or more embodiments, this computation may be performed by multiplication of sensor measurements row vector $M_S$ with a Recovery Matrix R using the expression (expanded for eight sensors):

$$D_M = [H\cos(B) H\sin(B) G\cos(2B) G\sin(2B)] = M_S R = [V_1 V_2 \ldots V_8] R \quad \text{(Eq. 14)}$$

In Equation 14, as expanded for eight sensors, recovery matrix R would be a 8×4 matrix. Recovery matrix R may be determined using a variant of least squares as:

$$R = T_C^T (T_C T_C^T)^{-1} \quad \text{(Eq. 15)}$$

In one or more embodiments, the recovery matrix R may be pre-computed from the tool constant matrix $T_C$ and stored on the in memory within gradient tool 100 for readily computing the design matrix $D_M$ from the sensor measurements matrix $M_S$. From design matrix $D_M$, the following desired quantities can be recovered:

$$H = \sqrt{d_{m1}^2 + d_{m2}^2} = \sqrt{H^2(\cos^2(B) + \sin^2(B))} \quad \text{(Eq. 16)}$$

$$R = \left|\frac{H}{G}\right| = \frac{H}{\sqrt{d_{m3}^2 + d_{m4}^2}} = \frac{H}{\sqrt{G^2(\cos^2(2B) + \sin^2(2B))}} \quad \text{(Eq. 17)}$$

$$\beta = B - \beta_{ref} = \arctan\left(\frac{d_{m2}}{d_{m1}}\right) - \beta_{ref} = \arctan\left(\frac{H\sin(B)}{H\cos(B)}\right) - \beta_{ref} \quad \text{(Eq. 18)}$$

These results are readily combinable with the tool roll angle, inclination and azimuth orientation in space determinations using standard MWD measurements and methods of analysis, to give the direction in space and the relative longitudinal orientation of the target wellbore from the injection wellbore.

The above discussion of calibration relies on concepts and processing methods by using an infinite line source approximation to initially calculate the calibration design matrix $D_{MC}$, upon which all of the subsequent calculations rely. In practice, however, it is difficult to implement an infinite line source calibration, because a very large current loop must be used to achieve an acceptable infinite line source approximation. In contrast, the present disclosure provides a method to use finite current loop dimensions to calibrate gradient sensors 30 using an "effective distance" concept to account for the finite dimension of current loop. Thus, according to one or more embodiments, gradiometer tool 100 can be calibrated with a practical current loop size, which allows a much more easily controlled environment than when calibrating with a large current loop.

Referring now to FIGS. 5A and 5B, the effect of finite current loop size is illustrated. FIGS. 5A and 5B show line sources and corresponding magnetic fields H for an infinite line source and a finite current loop, respectively. As shown in FIG. 5A, for an infinite line source 62, a uniform circular magnetic field H is generated around the line source, the strength of which is easily determinable at observation point 64 by Equation 1 above.

However, as shown in FIG. 5B, for a rectangular current loop 66, because there are four individual line source components 67a-67d in loop 66, each line source component 67 will contribute to the magnetic field extant at an observation point 68. Even if observation point 68 is very close to one of the line source component (e.g., the left-side line source 67a, as illustrated), if the dimensions of the current loop are relatively small compared to the wavelength of the frequency of the current flowing through the current loop, the other three line source components (e.g., 67b-67d) will still affect the field measurement at observation point 68.

Figure 6A:
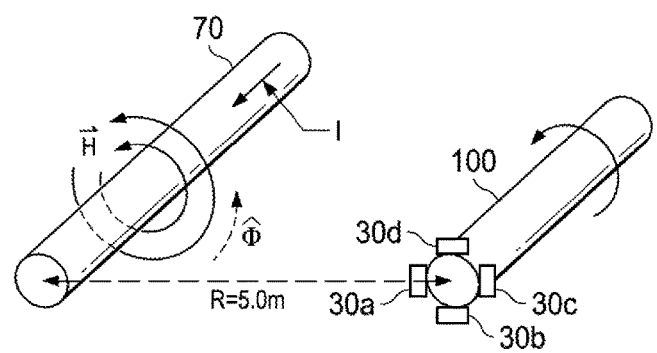
FIGS. 6A and 6B are diagrammatic displays of exemplary calibration setups using a theoretical infinite line source and a finite current loop source, respectively, for calibrating a gradiometer tool according to one or more embodiments.

The effect of a finite current loop may be quantified in the following exemplary example with reference to FIGS. 6A, 6B, 7A, 7B, and 8. FIG. 6A illustrates an ideal calibration arrangement using an infinite line current source 70, carrying a current I, and a gradiometer tool 100 disposed at a distance R=5.0 m from line source 70. In the embodiment illustrated, gradiometer tool 100 includes four sensors 30a-30d, although any suitable number of sensors 30 may be employed.

Figure 6B:
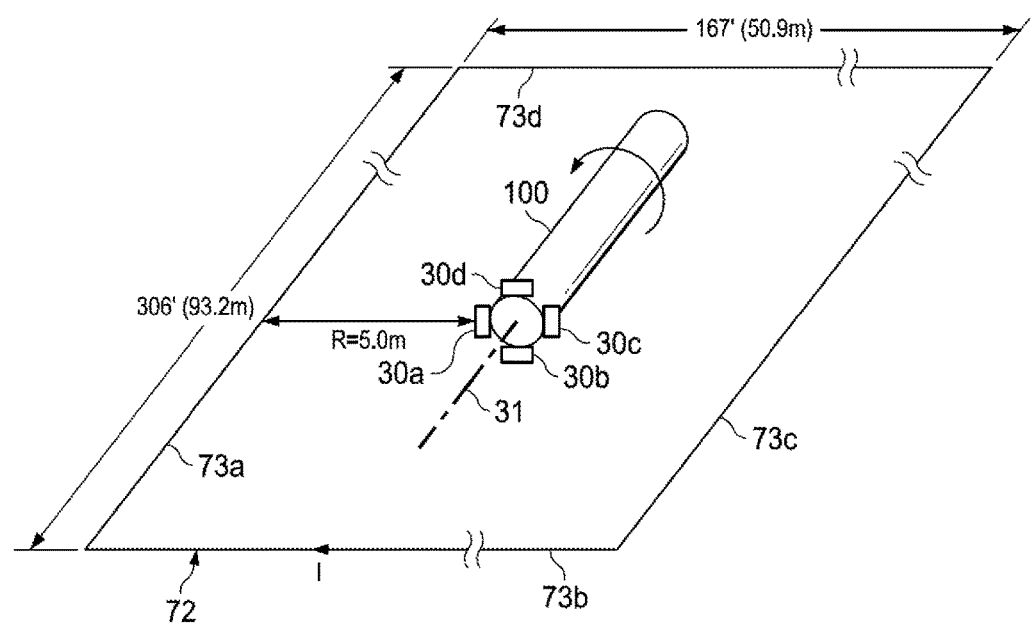

However, as illustrated in FIG. 6B, a rectangular current loop 72 is typically used to achieve an infinite line source approximation. Gradiometer tool 100 is placed at R=5.0 m from a primary line source component 73a of current loop 72 so that the tool measurements are dominated by that line source 73a. Still, as exemplified below, unless very large size loop (e.g., 150 m×300 m) is used, this approximation is only valid for the uniform magnetic field component $H_0$, not gradient field component $H_G$.

Figure 7A:
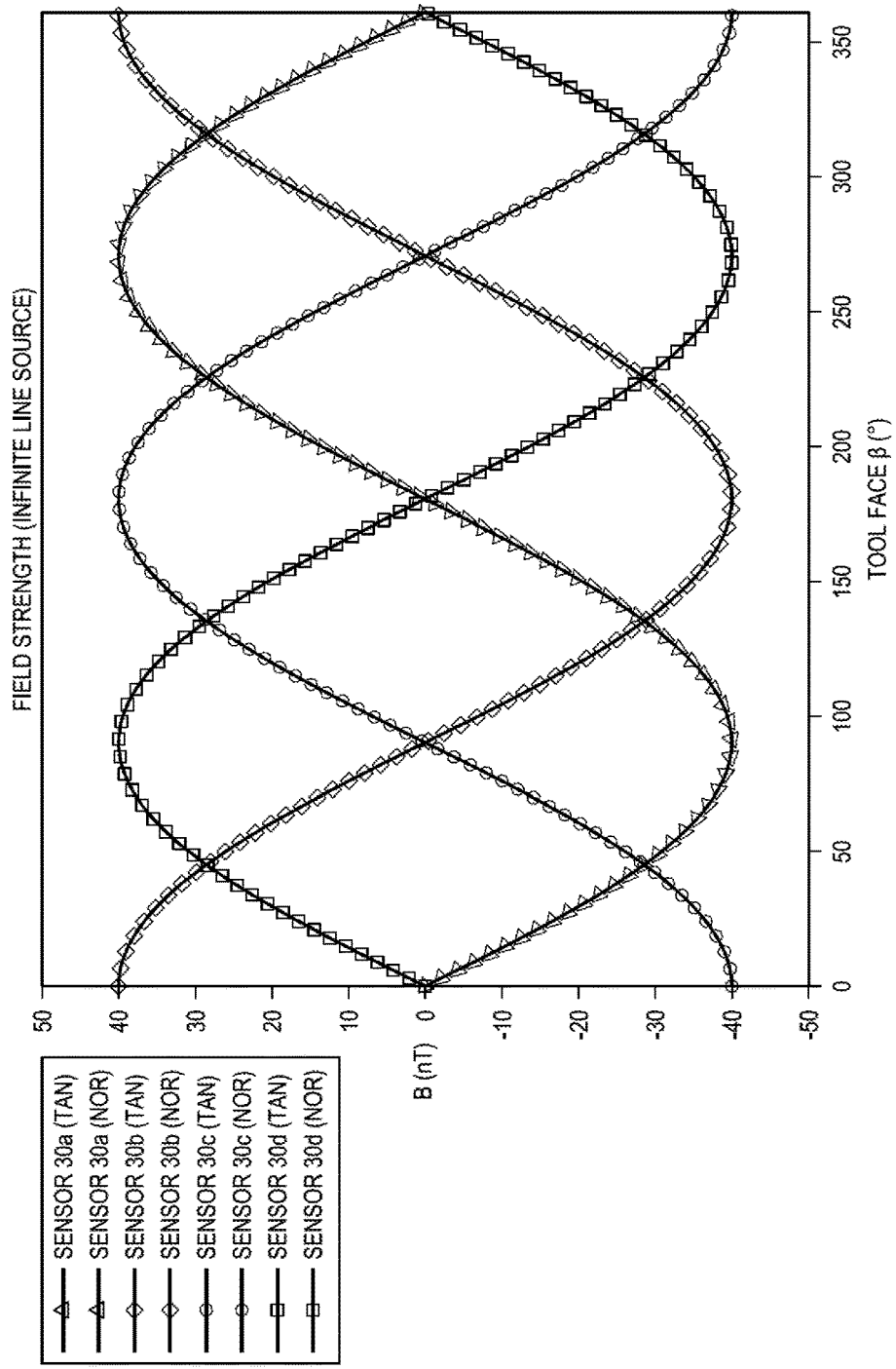
FIGS. 7A and 7B are plots of forward-modeled magnetic flux densities of the exemplary calibration setups of FIGS. 6A and 6B, respectively, according to one or more embodiments.
Figure 7B:
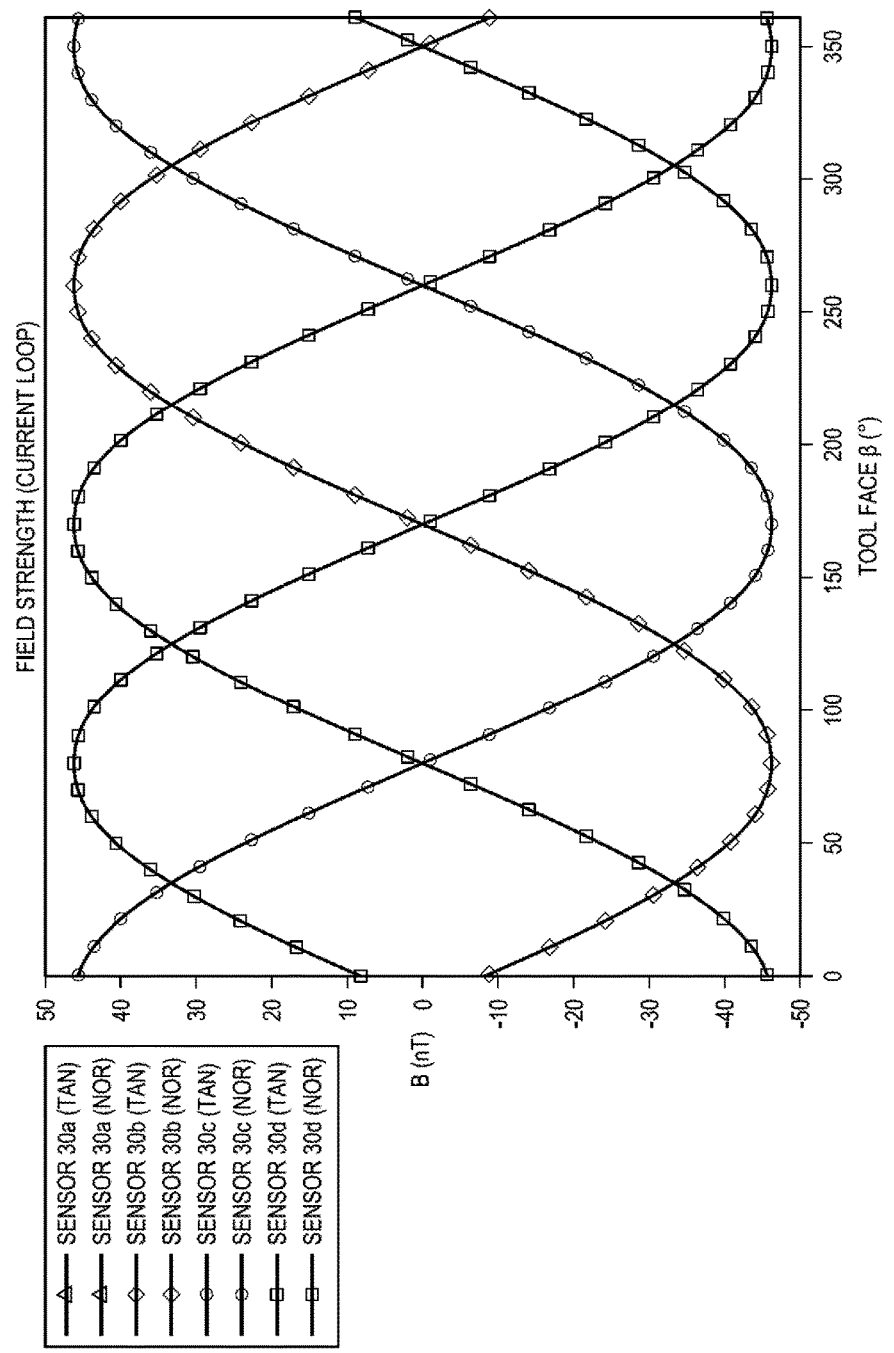

FIG. 7A shows a modeled response of the of the infinite line source configuration of FIG. 6A, and FIG. 7B shows a modeled response of the of the finite current loop source configuration of FIG. 6B. Gradiometer tool 100, equipped with four sensors 30 each capable of tangential and normal component measurements, is placed parallel and next to the current sources 70, 72 at the same separation of R. In the modeled responses, both cases have current amplitude of 1 A and separation R=5.0 m.

More particularly, FIGS. 7A and 7B are plots of modeled magnetic field strength (specifically, the flux density B, where the flux density B is the product of the magnetic field H with the magnetic permeability μ, i.e., B=μH) at the location of each sensor 30 (normal and tangential components) as sensors 30 are swept through 360 degrees when gradiometer tool 100 is rotated about its tool axis. The modeled response of FIG. 7A may be appropriately calculated based on the infinite line source Equations 1 and 2 above, whereas the modeled response of FIG. 7B may be computed, for example, by superposition of the uniform and gradient magnetic field components resulting from each of the four line source components 73 of finite current loop 72 using well-known relations, such as the law of Biot Savart. That is, the theoretical combined magnetic field H (or flux density B) may be forward modeled for a given sensor 30 of gradiometer tool 100 oriented at a known tool face angle β and position, taking into effect the contribution of each line source component 73.

As shown in the FIGS. 7A and 7B, both cases show only small differences between each sensor response. For infinite line source 70, the maximum flux density B is around 40 nT, as shown in FIG. 7A. However, as shown in FIG. 7B, for the current loop source 72 the maximum flux density B is around 45 nT. The difference between the flux density plots of FIGS. 7A and 7B is caused by the finite length of the primary line source component 73a and the magnetic field contributions of the three, non-primary line source components 73b-73d of current loop 72.

Once determined, the forward-modeled data of the magnetic field at the nominal sensor position as a function of tool face angle β may be mapped using Equations 1 and 2 to a theoretical or synthetic magnetic field due to an infinite line source as a function of tool face angle β to calculate one or more "effective distance" values $R_{eff}$. That is, given the modeled synthetic magnetic field that would be extent at a particular sensor 30 of gradiometer tool 100 at a given tool face angle β due to a known finite current loop, an effective distance $R_{eff}$ to a theoretical line source that would create an equivalent magnetic field can be calculated. A number of effective distance values $R_{eff}$ can be calculated for gradiometer tool 100 over a range of tool face angles β.

Figure 8:
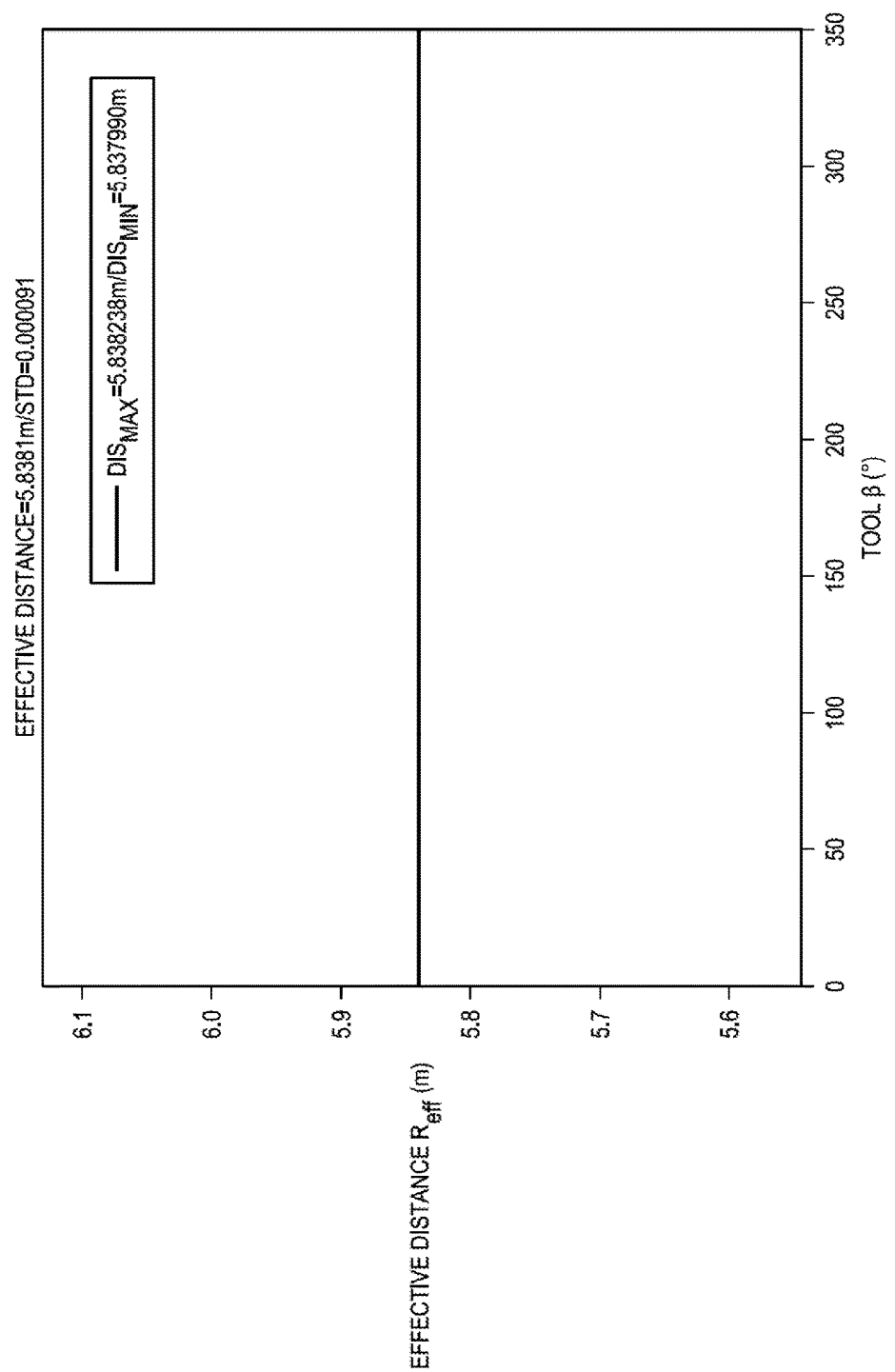
FIG. 8 is a plot of forward-modeled effective distance to an infinite line source of the finite current loop source setup of FIG. 6B according to one or more embodiments, illustrating the effect of using a finite current loop source for calibration.

For example, FIG. 8 is a plot of effective distance $R_{eff}$ over a 360 degree range of tool face angles β for infinite line source and finite current loop calibration setups of FIGS. 6A and 6B using the forward-modeled magnetic field data of FIGS. 7A and 7B, respectively. Although gradiometer tool 100 is 5.0 m away from line source component 73a, the effective distance using direct calculation is approximately 5.8 m and varies slightly at different tool face angles ft. Consequently, the line source assumption upon which Equations 1 and 2 are based may be too approximate for use with a current loop source, and depending on the size of the finite current loop used in calibration, Equation 7 may be insufficiently accurate for operational needs.

FIGS. 9A and 9B are a flow chart of a method 200, according to one or more embodiments, to account for the finite size of current loop, wherein an effective distance $R_{eff}$ is used to replace the distance R in Equations 1 and 2. Steps 204-234 are calibration steps that may be performed in a laboratory environment. Steps 240-248 are measurement steps that may be performed in the field, such as in wellbore 12 (FIG. 1) in SAGD operations or the like.

Figure 9:
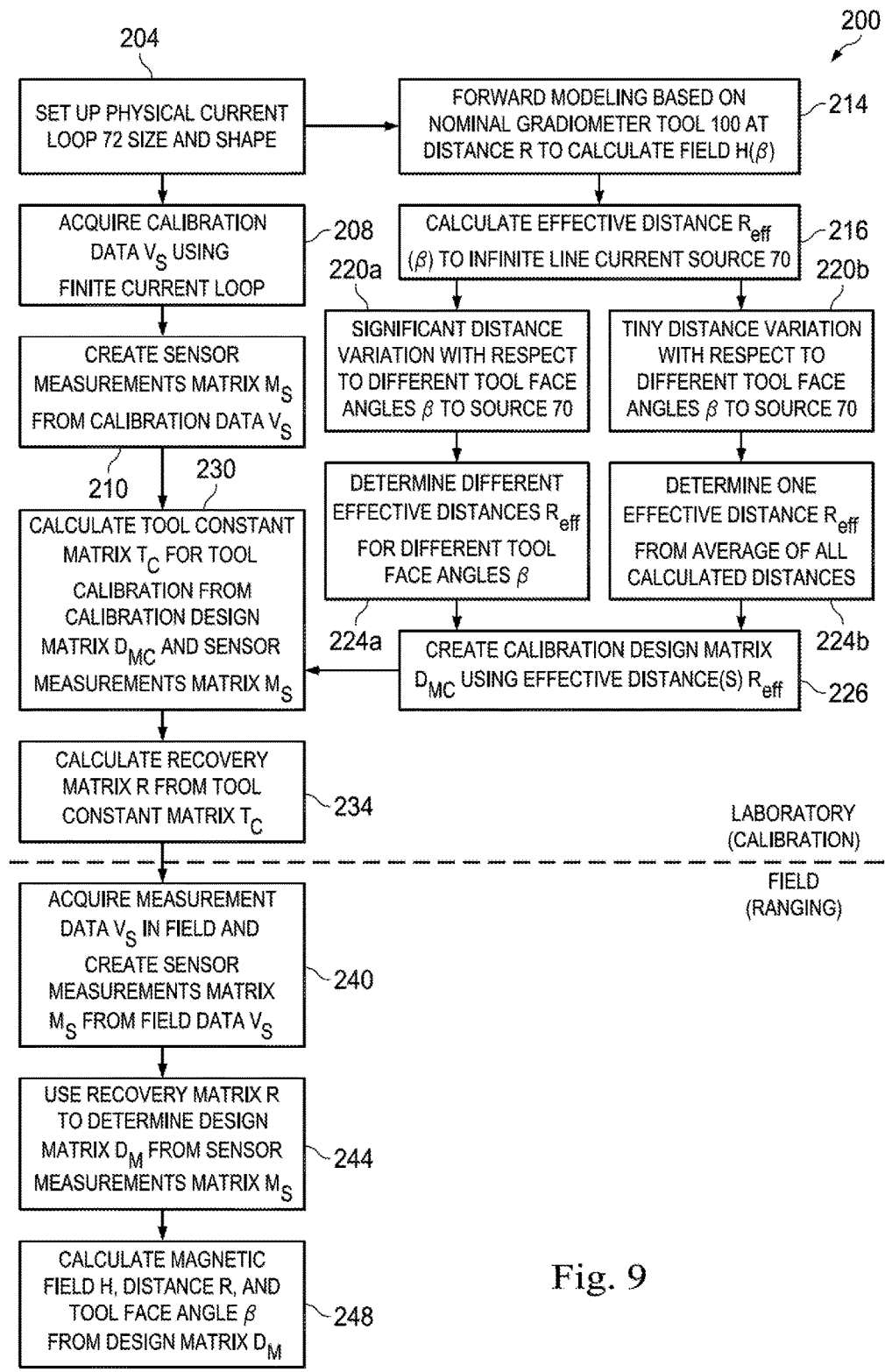
FIGS. 9A and 9B are a flowchart of a calibration and ranging method using an effective distance calculation according to one or more embodiments of the present disclosure.

Referring to FIGS. 6B and 9, first, at step 204, physical dimensions and quantities of the actual calibration setup (such as that shown in FIG. 6B), i.e., the physical dimensions of current loop 72, the current I flowing in loop 72, and the position R of gradiometer tool 100 with respect to the predominant line source component 73a, are established. Current loop 72 may be any shape as long as the relative positions of the line source components 73 to gradiometer tool 100 are precisely measured.

At steps 208 and 210, current I within loop 72 is held constant, and gradiometer tool 100 is rotated about its tool axis 31, while sensor voltage measurements $V_S$ are taken and compiled into a sensor measurements matrix $M_s$. The operation of steps 208 and 210 are described above with respect to Equation 9.

Steps 214-226 may be performed concurrently with, prior to, or subsequent to steps 208 and 210. At step 214, the physical parameters of current loop 72 and gradiometer tool 100, as established in step 210, are used to mathematically model the resultant magnetic field H and gradient G at gradiometer tool 100, for example, as a superposition of the effects of all line source components 73a-73d. Such modeling is described above with respect to FIG. 7B. At step 216, the modeled data of step 214 may be used to calculate a number of effective distance $R_{eff}$ values to a theoretical infinite line source 70 (FIG. 7A) at differing tool face angles β, i.e., $R_{eff}(β)$. The operation of step 216 is described above with respect to FIG. 8B.

It may be noted from FIG. 8B that in the exemplary calibration setup of FIG. 6B, there are small distance variations in the calculated effective distance $R_{eff}$ values with respect to different tool face angles β. As the dimensions of current loop 72 become smaller, effective distance $R_{eff}$ variations become larger. Consequently, instead of choosing only one effective distance $R_{eff}$, different effective distances $R_{\it eff}$ corresponding to different tool face angles β may be used. Accordingly, referring back to FIG. 9, in one or more embodiments, steps 220a and 224a may be performed, while in other embodiments, steps 220b and 224b may be performed. If variation of the calculated effective distances as a function of tool angle $R_{\it eff}(\beta)$ is sufficiently small due to a relatively large size of current loop 72, then the effective distance can be calculated using the average of all calculated distance, as depicted by steps 220b and 224b. However, if significant variation of $R_{\it eff}(\beta)$ is observed, one can use each calculated effective distance $R_{\it eff}$ value as to generate an effective distance library for different tool face angles β, as depicted by steps 220a and 224a.

Next, at step 226, a calibration design matrix $D_{MC}$ is calculated, as described above with respect to Equations 9 and 11, except that one or more effective distance $R_{\it eff}$ values, determined at step 224a or 224b, is substituted for distance R of Equations 1 and 2, thereby compensating for the effects of finite current source 72. Thereafter, at step 230, a tool constant matrix $T_C$ may be calculated from the sensor measurements matrix $M_s$ determined at step 210 and the calibration design matrix $D_{MC}$ determined at step 226, as described above with respect to Equations 10 and 13. From the tool constant matrix $T_C$, a recovery matrix R may be computed at step 234 as described above with respect to Equation 15.

The recovery matrix R may be stored in memory within gradient tool 100 to be used in ranging operations 240-248. At step 240, gradiometer tool 100 may be located in the field and subjected to unknown magnetic field H. In one or more embodiments, gradiometer tool 100 may be located in wellbore 12, and magnetic field H may be created by applying an alternating current through casing 11 of target wellbore 10, as depicted in FIG. 1. Sensor voltage measurements $V_S$ are taken and compiled into a sensor measurements matrix $M_s$, as described above with respect to Equation 9. At step 244, recovery matrix R calculated at step 234 may be used with sensor measurements matrix $M_s$ to calculate the design matrix $D_M$, as described above with respect to Equation 14. Finally, at step 248, the magnetic field H, the distance R to the current source, and the tool face angle β may be determined as described above with respect to Equations 16-18.

Figure 10:
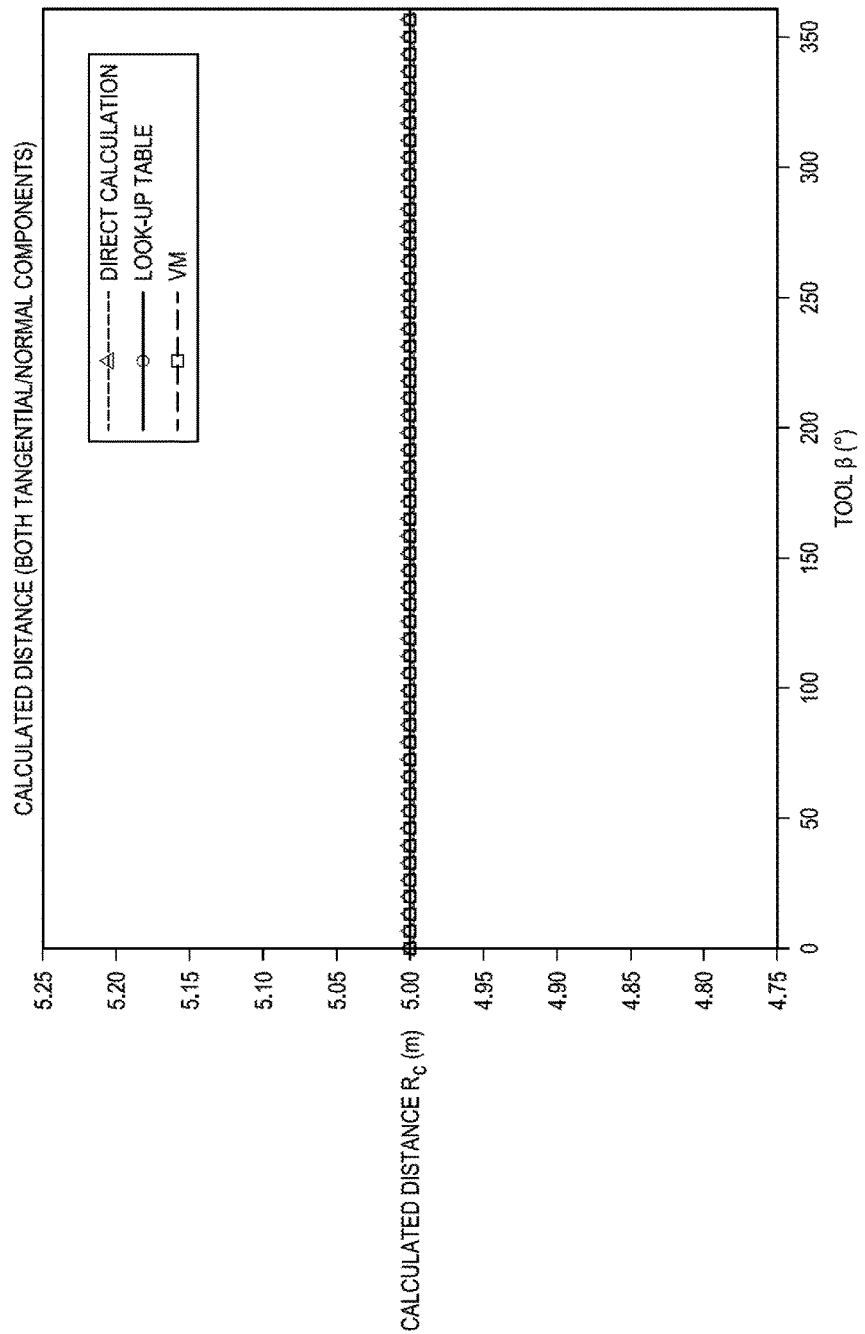
FIG. 10 is an exemplary plot of a calculated distance to the magnetic field source of FIG. 6A using a gradiometer tool calibrated and calculated according to the method of FIG. 9.

Although ranging steps 240-248 may be used in the field, the ranging steps may also be used to validate the calibration method of steps 204-234. For example, after calculating recovery matrix R at step 234, the distance R to primary line source component 73a of finite current loop 72 used for calibration may be calculated in the laboratory according to steps 240-248. FIG. 10 shows the calculated distance $R_c$ of FIG. 6B according to method 200 of FIG. 9. As shown in the results, calculated distance $R_c$ is very close to the precise physical measured distance R of 5.0 m. Accordingly, method 200 is effective to accurately calibrate gradient tool 100 with fields from finite current loop 72 of practical dimensions. Method 200 may be used with existing gradiometer tools to increase operational accuracy and reduce cost in SAGD and like applications.

Referring to FIGS. 1 and 9, drilling system 99, gradiometer tool 100, and method 200 as disclosed herein may be used in a variety of applications, including SAGD applications. Other illustrative applications include, for example, applications for accurately and reliably positioning a wellbore being drilled, the "relief/intersecting" wellbore (i.e., second wellbore), with respect to a nearby target first wellbore, usually a blowout wellbore, so that the second wellbore intersects or avoids the target wellbore as desired, and the drilling of relief wells and/or wellbore avoidance operations.

Although the above description refers to induced voltage measurements $V_S$, a routineer in the art would understand that such measurements may also include induced magnetic field.

In summary, a method to calibrate a gradiometer tool, a method for ranging using a gradiometer tool, a gradiometer tool, and a ranging system have been described. Embodiments of a method to calibrate a gradiometer tool may generally include: providing a current loop of known finite dimensions; disposing a gradiometer tool, including at least one magnetic field sensor, at a known distance (R) from a primary linear current source component of the current loop; while flowing a known current (I) through the current loop, measuring a set of induced measurements from the at least one sensor over a range of tool face angles (β); from the set of induced measurements, generating a sensor measurements matrix ($M_S$); modeling a set of synthetic magnetic field values extent at the at least one sensor over the range of tool face angles due to the current loop of known finite dimensions, the gradiometer tool, and the current; calculating at least one effective distance ($R_{\it eff}$) corresponding to at least one of the set of synthetic magnetic field values using a gradient concept of infinite line source; creating a calibration design matrix ($D_{MC}$) using the at least one effective distance; and calculating a tool constant matrix ($T_C$) characterizing the gradiometer tool from the calibration design matrix and the sensor measurements matrix. Embodiments of a method for ranging using a gradiometer tool may generally include: providing a current loop of known finite dimensions; disposing a gradiometer tool, including at least one magnetic field sensor, at a known distance (R) from a primary linear current source component of the current loop; while flowing a known current (I) through the current loop, measuring a first set of induced measurements from the at least one sensor over a range of tool face angles (β); from the first set of induced measurements, generating a first sensor measurements matrix ($M_S$); modeling a set of synthetic magnetic field values extent at the at least one sensor over the range of tool face angles due to the current loop of known finite dimensions, the gradiometer tool, and the current; calculating at least one effective distance ($R_{\it eff}$) corresponding to at least one of the set of synthetic magnetic field values using a gradient concept of infinite line source; creating a calibration design matrix ($D_{MC}$) using the at least one effective distance; calculating a tool calibration matrix ($T_C$) characterizing the gradiometer tool from the calibration design matrix and the sensor measurements matrix; disposing the gradiometer tool in proximity to a second current source; measuring a second set of induced measurements induced by the second current source from the at least one sensor; from the second set of induced measurements, generating a second sensor measurements matrix ($M_S$); and determining a design matrix ($D_M$) from the second sensor measurements matrix and the tool calibration matrix. Embodiments of a gradiometer tool may generally have: at least one magnetic field sensor; a processor; and a memory storing a recovery matrix (R) obtained by modeling a set of magnetic field values extent at the at least one sensor over the range of tool face angles due to a known current (I) flowing through a current loop of known finite dimensions at a known distance with respect to the gradiometer tool and calculating at least one effective distance ($R_{\it eff}$) corresponding to at least one of the set of synthetic magnetic field values using a gradient concept of infinite line source.

Embodiments of a ranging system may generally have: a current source disposed within a target first wellbore; a drilling string disposed in a second wellbore proximal to the current source; and a gradiometer tool included along the drilling string and having at least one magnetic field sensor, a processor, and a memory storing a recovery matrix (R) obtained by modeling a set of synthetic magnetic field values extent at the at least one sensor over the range of tool face angles due to a known current (I) flowing through a current loop of known finite dimensions at a known distance with respect to the gradiometer tool and calculating at least one effective distance ($R_{eff}$) corresponding to at least one of the set of synthetic magnetic field values using a gradient concept of infinite line source.

Any of the foregoing embodiments may include any one of the following elements or characteristics, alone or in combination with each other: calculating a recovery matrix (R) from the tool constant matrix; storing the recovery matrix with a memory of the gradiometer tool; calculating a plurality of effective distances with respect to different tool face angles corresponding to at least the one of the set of synthetic magnetic field values using the gradient concept of infinite line source; creating the calibration design matrix using the plurality of effective distances; calculating a plurality of effective distances corresponding to at least the one of the set of synthetic magnetic field values using the gradient concept of infinite line source; calculating an average of the plurality of effective distances; creating the calibration design matrix using the average of the plurality of effective distances; calculating a recovery matrix (R) from the tool constant matrix; determining the design matrix using the recovery matrix; calculating a distance from the gradiometer tool to the second current source from the design matrix; calculating a tool face angle of the gradiometer tool with respect to second current source from the design matrix; calculating a plurality of effective distances corresponding to at least the one of the set of magnetic field values that would arise if the gradiometer tool is placed to the theoretical infinite line source carrying the current at the effective distance; creating the calibration design matrix using the plurality of effective distances; calculating a plurality of effective distances corresponding to at least the one of the set of magnetic field values that would arise if the gradiometer tool is placed to the theoretical infinite line source carrying the current at the effective distance; calculating an average of the plurality of effective distances; creating the calibration design matrix using the average of the plurality of effective distances; disposing the second current source within a target first wellbore; disposing the gradiometer tool within a second wellbore being drilled; the gradiometer tool is characterized by a tool calibration matrix ($T_C$) calculated based on the at least one effective distance; the at least one sensor is operable to provide a set of voltage measurements ($V_S$) induced by a magnetic field (H); the processor is operable to generate a sensor measurements matrix ($M_S$) from the set of voltage measurements and determine a design matrix ($D_M$) from the sensor measurements matrix and the recovery matrix; the processor is operable to calculate the magnetic field from the design matrix; the gradient concept of infinite line source determines the synthetic magnetic field values that would arise if the gradiometer tool is placed to a theoretical infinite line source carrying the current at the effective distance; the gradiometer tool is characterized by a tool calibration matrix ($T_C$) calculated based on the at least one effective distance; the at least one sensor is operable to provide a set of voltage measurements ($V_S$) induced by the current source; the processor is operable to generate a sensor measurements matrix ($M_S$) from the set of voltage measurements and determine a design matrix ($D_M$) from the sensor measurements matrix and the recovery matrix; and the processor is operable to calculate from the design matrix a distance to the current source and a tool face angle of the gradiometer tool with respect to the current source.

The Abstract of the disclosure is solely for providing the a way by which to determine quickly from a cursory reading the nature and gist of technical disclosure, and it represents solely one or more embodiments.

While various embodiments have been illustrated in detail, the disclosure is not limited to the embodiments shown. Modifications and adaptations of the above embodiments may occur to those skilled in the art. Such modifications and adaptations are in the spirit and scope of the disclosure.

What is claimed:

1. A method to calibrate a gradiometer tool comprising:
providing a current loop of known finite dimensions;
disposing a gradiometer tool, including at least one magnetic field sensor, at a known distance (R) from a primary linear current source component of said current loop;
while flowing a known current (I) through said current loop, measuring a set of induced measurements from said at least one sensor over a range of tool face angles ($\beta$);
from said set of induced measurements, generating a sensor measurements matrix ($M_S$);
modeling a set of synthetic magnetic field values extent at said at least one sensor over said range of tool face angles due to said current loop of known finite dimensions, said gradiometer tool, and said current;
calculating at least one effective distance ($R_{eff}$) corresponding to at least one of said set of synthetic magnetic field values using a gradient concept of infinite line source;
creating a calibration design matrix ($D_{MC}$) using said at least one effective distance; and
calculating a tool constant matrix ($T_C$) characterizing said gradiometer tool from said calibration design matrix and said sensor measurements matrix.

2. The method of claim 1 further comprising:
calculating a recovery matrix (R) from said tool constant matrix; and
storing said recovery matrix with a memory of said gradiometer tool.

3. The method of claim 1 further comprising:
calculating a plurality of effective distances with respect to different tool face angles corresponding to at least said one of said set of synthetic magnetic field values using said gradient concept of infinite line source; and
creating said calibration design matrix using said plurality of effective distances.

4. The method of claim 1 further comprising:
calculating a plurality of effective distances corresponding to at least said one of said set of synthetic magnetic field values using said gradient concept of infinite line source;
calculating an average of said plurality of effective distances; and
creating said calibration design matrix using said average of said plurality of effective distances.

5. A method for ranging using a gradiometer tool comprising,
- providing a current loop of known finite dimensions;
- disposing a gradiometer tool, including at least one magnetic field sensor, at a known distance (R) from a primary linear current source component of said current loop;
- while flowing a known current (I) through said current loop, measuring a first set of induced measurements from said at least one sensor over a range of tool face angles ($\beta$);
- from said first set of induced measurements, generating a first sensor measurements matrix ($M_S$);
- modeling a set of synthetic magnetic field values extent at said at least one sensor over said range of tool face angles due to said current loop of known finite dimensions, said gradiometer tool, and said current;
- calculating at least one effective distance ($R_{eff}$) corresponding to at least one of said set of synthetic magnetic field values using a gradient concept of infinite line source;
- creating a calibration design matrix ($D_{MC}$) using said at least one effective distance;
- calculating a tool calibration matrix ($T_C$) characterizing said gradiometer tool from said calibration design matrix and said sensor measurements matrix;
- disposing said gradiometer tool in proximity to a second current source;
- measuring a second set of induced measurements induced by said second current source from said at least one sensor;
- from said second set of induced measurements, generating a second sensor measurements matrix ($M_S$); and
- determining a design matrix ($D_M$) from said second sensor measurements matrix and said tool calibration matrix.

6. The method of claim 5 further comprising:
- calculating a recovery matrix (R) from said tool constant matrix; and
- determining said design matrix using said recovery matrix.

7. The method of claim 5 further comprising:
- calculating a distance from said gradiometer tool to said second current source from said design matrix; or
- calculating a tool face angle of said gradiometer tool with respect to second current source from said design matrix.

8. The method of claim 5 further comprising:
- calculating a plurality of effective distances corresponding to at least said one of said set of magnetic field values that would arise if said gradiometer tool is placed to said theoretical infinite line source carrying said current at said effective distance; and
- creating said calibration design matrix using said plurality of effective distances.

9. The method of claim 5 further comprising:
- calculating a plurality of effective distances corresponding to at least said one of said set of magnetic field values that would arise if said gradiometer tool is placed to said theoretical infinite line source carrying said current at said effective distance;
- calculating an average of said plurality of effective distances; and
- creating said calibration design matrix using said average of said plurality of effective distances.

10. The method of claim 5 further comprising:
- disposing said second current source within a target first wellbore; and
- disposing said gradiometer tool within a second wellbore being drilled.

11. A gradiometer tool comprising:
- at least one magnetic field sensor;
- a processor; and
- a memory storing a recovery matrix (R) obtained by modeling a set of magnetic field values extent at said at least one sensor over said range of tool face angles due to a known current (I) flowing through a current loop of known finite dimensions at a known distance with respect to said gradiometer tool and calculating at least one effective distance ($R_{eff}$) corresponding to at least one of said set of synthetic magnetic field values using a gradient concept of infinite line source.

12. The gradiometer tool of claim 11 wherein:
said gradiometer tool is characterized by a tool calibration matrix ($T_C$) calculated based on said at least one effective distance.

13. The gradiometer tool of claim 11 wherein:
- said at least one sensor is operable to provide a set of voltage measurements ($V_S$) induced by a magnetic field (H); and
- said processor is operable to generate a sensor measurements matrix ($M_S$) from said set of voltage measurements and determine a design matrix ($D_M$) from said sensor measurements matrix and said recovery matrix.

14. The gradiometer tool of claim 13 wherein:
said processor is operable to calculate said magnetic field from said design matrix.

15. The gradiometer tool of claim 11 wherein:
said gradient concept of infinite line source determines said synthetic magnetic field values that would arise if said gradiometer tool is placed to a theoretical infinite line source carrying said current at said effective distance.

16. A ranging system comprising:
- a current source disposed within a target first wellbore;
- a drilling string disposed in a second wellbore proximal to said current source; and
- a gradiometer tool included along said drilling string and having at least one magnetic field sensor, a processor, and a memory storing a recovery matrix (R) obtained by modeling a set of synthetic magnetic field values extent at said at least one sensor over said range of tool face angles due to a known current (I) flowing through a current loop of known finite dimensions at a known distance with respect to said gradiometer tool and calculating at least one effective distance ($R_{eff}$) corresponding to at least one of said set of synthetic magnetic field values using a gradient concept of infinite line source.

17. The ranging system of claim 16 wherein:
said gradiometer tool is characterized by a tool calibration matrix ($T_C$) calculated based on said at least one effective distance.

18. The ranging system of claim 16 wherein:
- said at least one sensor is operable to provide a set of voltage measurements ($V_S$) induced by said current source; and
- said processor is operable to generate a sensor measurements matrix ($M_S$) from said set of voltage measurements and determine a design matrix ($D_M$) from said sensor measurements matrix and said recovery matrix.

19. The gradiometer tool of claim 18 wherein:
said processor is operable to calculate from said design matrix a distance to said current source and a tool face angle of said gradiometer tool with respect to said current source.

20. The gradiometer tool of claim 16 wherein:
said gradient concept of infinite line source determines said synthetic magnetic field values that would arise if said gradiometer tool is placed to a theoretical infinite line source carrying said current at said effective distance.

\* \* \* \* \*